United States Patent
Hirano et al.

(10) Patent No.: US 11,355,362 B2
(45) Date of Patent: Jun. 7, 2022

(54) WASHING METHOD, WASHING DEVICE, STORAGE MEDIUM, AND WASHING COMPOSITION

(71) Applicants: TOKYO OHKA KOGYO CO., LTD., Kawasaki (JP); TOKYO ELECTRON LIMITED, Tokyo (JP)

(72) Inventors: Isao Hirano, Kawasaki (JP); Shoichi Terada, Tokyo (JP); Junji Nakamura, Tokyo (JP); Takayuki Toshima, Tokyo (JP)

(73) Assignees: Tokyo Ohka Kogyo Co., Ltd., Kawasaki (JP); Tokyo Electron Limited, Tokyo (JP)

( * ) Notice: Subject to any disclaimer, the term of this patent is extended or adjusted under 35 U.S.C. 154(b) by 62 days.

(21) Appl. No.: 16/606,660

(22) PCT Filed: Feb. 2, 2018

(86) PCT No.: PCT/JP2018/003684
§ 371 (c)(1),
(2) Date: Oct. 18, 2019

(87) PCT Pub. No.: WO2018/198466
PCT Pub. Date: Nov. 1, 2018

(65) Prior Publication Data
US 2020/0098593 A1   Mar. 26, 2020

(30) Foreign Application Priority Data

Apr. 25, 2017 (JP) .............................. JP2017-086690

(51) Int. Cl.
| | | |
|---|---|---|
| *H01L 21/02* | (2006.01) | |
| *H01L 21/027* | (2006.01) | |
| *H01L 21/304* | (2006.01) | |
| *H01L 21/3065* | (2006.01) | |
| *H01L 21/308* | (2006.01) | |
| *H01L 21/324* | (2006.01) | |
| *H01L 21/67* | (2006.01) | |
| *C11D 7/08* | (2006.01) | |
| *C11D 7/34* | (2006.01) | |
| *G03F 7/42* | (2006.01) | |

(52) U.S. Cl.
CPC .......... *H01L 21/67028* (2013.01); *C11D 7/08* (2013.01); *C11D 7/34* (2013.01); *G03F 7/42* (2013.01); *H01L 21/027* (2013.01); *H01L 21/02052* (2013.01); *H01L 21/304* (2013.01); *H01L 21/308* (2013.01); *H01L 21/3065* (2013.01); *H01L 21/324* (2013.01); *H01L 21/67098* (2013.01); *H01L 21/67248* (2013.01)

(58) Field of Classification Search
CPC ................. G03F 7/42; H01L 21/02052; H01L 21/02057; H01L 21/324; B08B 3/106
See application file for complete search history.

(56) References Cited

U.S. PATENT DOCUMENTS

| | | | | |
|---|---|---|---|---|
| 5,059,711 A | * | 10/1991 | Bielefeldt | ............. C07C 309/00 562/113 |
| 5,503,708 A | * | 4/1996 | Koizumi | ........... H01L 21/31138 438/708 |
| 5,868,862 A | | 2/1999 | Douglas et al. | |
| 6,610,168 B1 | * | 8/2003 | Miki | ........................ B08B 3/00 134/26 |
| 2002/0016076 A1 | | 2/2002 | Kato et al. | |
| 2007/0161248 A1 | * | 7/2007 | Christenson | .............. B08B 3/08 438/689 |
| 2007/0256711 A1 | | 11/2007 | Hayashi et al. | |
| 2013/0089987 A1 | | 4/2013 | Gouk et al. | |

FOREIGN PATENT DOCUMENTS

| | | | | |
|---|---|---|---|---|
| JP | 55151335 A | * | 11/1980 | ............. G03F 7/423 |
| JP | S63-258844 A | | 10/1988 | |
| JP | H 03-072626 A | | 3/1991 | |
| JP | H 10-135170 A | | 5/1998 | |
| JP | H11-087291 A | | 3/1999 | |
| JP | 2004-146594 A | | 5/2004 | |
| JP | 2006-229002 A | | 8/2006 | |
| JP | 2007-237119 A | | 9/2007 | |
| JP | 2007-281148 A | | 10/2007 | |

OTHER PUBLICATIONS

Machine translation of abstract of JP55151335A; Taguchi et al. (Year: 1979).*

* cited by examiner

*Primary Examiner* — Natasha N Campbell
(74) *Attorney, Agent, or Firm* — Knobbe Martens Olson & Bear LLP

(57) ABSTRACT

A washing method, a washing device, a storage medium, and a washing composition for enabling effective removal of a layer to be processed by decomposing or degenerating the layer to be processed at a higher temperature than conventionally. In a state where a substrate provided with a layer to be processed is heated, the substrate is supplied with vapor of a component that can decompose the layer to be processed, and thereafter the layer to be processed that has reacted with the component is removed from the substrate. As the component, a nitric acid or a sulfonic acid is preferable. As the sulfonic acid, a fluorinated alkyl sulfonic acid is preferable.

13 Claims, 6 Drawing Sheets

WASHING METHOD, WASHING DEVICE, STORAGE MEDIUM, AND WASHING COMPOSITION

This application is the U.S. National Phase under 35 U.S.C. § 371 of International Application PCT/JP2018/003684, filed Feb. 2, 2018, designating the U.S., and published in Japanese as WO 2018/198466 on Nov. 1, 2018 which claims priority to Japanese Patent Application No. 2017-086690, filed Apr. 25, 2017, the entire content of which is incorporated herein by reference.

TECHNICAL FIELD

The present invention relates to a washing method, a washing device, a storage medium, and a washing composition.

BACKGROUND ART

In the production step of a semiconductor substrate, the step of forming a predetermined pattern is performed by etching a film to be etched, such as an interlayer dielectric film or a metal film, formed on a substrate such as a semiconductor wafer using a resist film as a mask material.

In recent years, a Cu multilayer wiring technique using a low dielectric constant film (Low-k film) as an interlayer dielectric film has attracted attention. In such Cu multilayer wiring technique, a dual damascene method is adopted, in which embedded wiring gutters or holes are formed in the Low-k film and Cu is embedded therein. A lot of organic materials are also used as a Low-k film. When etching such organic Low-k film, it is difficult to make a sufficient difference in an etching rate between the film and a resist, which is an organic film like the Low-k film. Therefore, an inorganic hardmask film such as a Ti film or a TiN film is used as a mask for etching.

After etching, the resist film and hardmask film remaining on a substrate are required to be removed from the substrate. There has been known, as such removal method, for example, a method in which the films are removed using an organic amine-based removal solution, an ammonium fluoride-based removal solution including ammonium fluoride, an inorganic removal solution or the like in a sheet-type washing device (see Patent Document 1).

Patent Document 1: Japanese Unexamined Patent Application, Publication No. 2004-146594

DISCLOSURE OF THE INVENTION

Problems to be Solved by the Invention

In a method using a removal solution as described in Patent Document 1, processing can be promoted by raising the temperature of the removal solution or a substrate. However, the upper limit of temperature has been constrained from the viewpoint of an influence of changes in the composition of a removal solution and the heat resistance of pipe members in the supply system of a removal solution.

The present invention was made in view of the above problem, and an object thereof is to provide a washing method, a washing device, a storage medium, and a washing composition, which can effectively remove a layer to be processed by decomposing or denaturing the layer to be processed at a temperature higher than before.

Means for Solving the Problems

The present inventors investigated in view of the above problem, and found that the above problem could be solved by a method in which, with a substrate with a layer to be processed heated, a vapor of a component (A) capable of decomposing the layer to be processed is supplied to the substrate, and the layer to be processed which has reacted with the component (A) is then removed from the substrate, thereby completing the present invention.

A first aspect of the present invention is a washing method, including: a heating step of heating a substrate with a layer to be processed, a reaction processing step of supplying a vapor of a component (A) capable of decomposing the layer to be processed to the heated substrate to allow the layer to be processed and the component (A) to react, and a removal step of removing the layer to be processed which has reacted with the component (A) from the substrate.

A second aspect of the present invention is a washing device, including: a heating part to heat a substrate with a layer to be processed, a vapor supply part to supply a vapor of a component (A) capable of decomposing the layer to be processed to the heated substrate to allow the layer to be processed and the component (A) to react, and a removal solution supply part to supply a removal solution for removing the layer to be processed which has reacted with the component (A) from the substrate.

A third aspect of the present invention is a recording medium, in which a program to allow a computer to perform a washing method according to the first aspect is stored.

A fourth aspect of the present invention is a washing composition, which is used in the washing method according to the first aspect and includes an acidic compound as the component (A).

Effects of the Invention

According to the present invention, it is possible to provide a washing method, a washing device, a storage medium, and a washing composition, which can effectively remove a layer to be processed by decomposing or denaturing the layer to be processed at a temperature higher than before.

PREFERRED MODE FOR CARRYING OUT THE INVENTION

The washing method, washing device, recording medium, and washing composition will now be described. The washing method is a method for washing a substrate so as to remove a layer to be processed from the substrate with the layer to be processed. The washing device is a device which is suitably used in the above-described washing method. The recording medium is a recording medium, in which a program to allow a computer to perform the above-described washing method is stored. The washing composition is a composition which is used in the above-described washing method.

Figure 6:
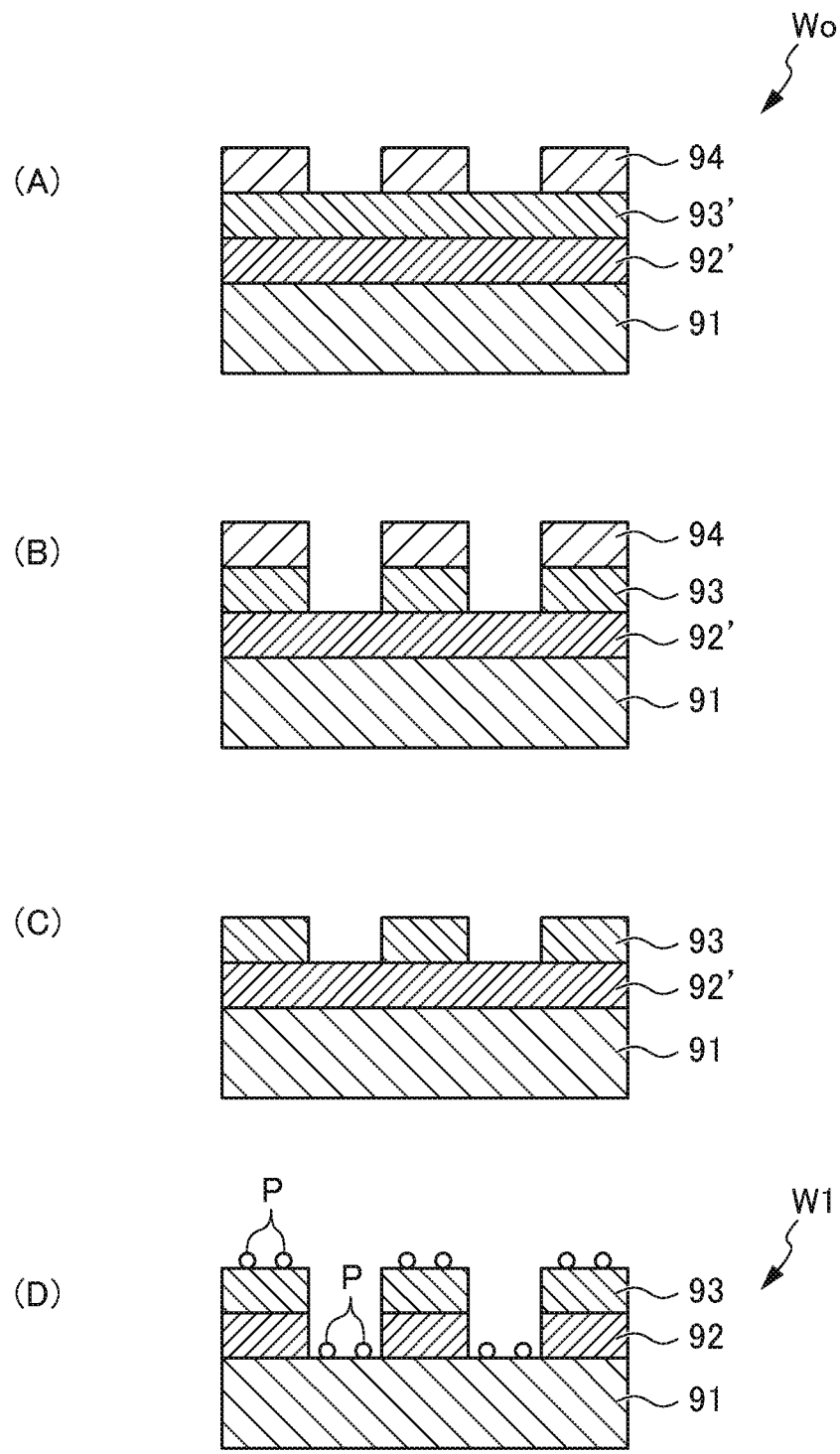
FIG. 6 are diagrams which schematically show an aspect in which a substrate to be washed is formed by dry etching.

First, a substrate to be washed will now be described with reference to FIG. 6. An example of the structure of a substrate to be washed W1 is shown in FIG. 6(D). As shown in FIG. 6(D), the substrate W1 has, for example, a semiconductor wafer 91, a film to be etched 92, and a layer to be processed 93 (hardmask film) in order. The film to be etched 92 and layer to be processed 93 are patterned into a predetermined pattern by a dry etching processing, and a concave-convex pattern is formed on the surface of the substrate W1. The semiconductor wafer 91 is, for example, a silicon wafer. The film to be etched 92 is, for example, an insulating film, an electrically conductive film or the like. The insulating film is, for example, a $SiO_2$ film, or a silicon insulating film such as a low dielectric constant film called Low-k film. The Low-k film is, for example, a film with a relative dielectric constant lower than that of silicon dioxide, such as a SiOC film or a SiCOH film. The electrically conductive film is, for example, a metal film such as a Cu film or an Al film. The layer to be processed 93 is an inorganic hardmask film, an organic hardmask film, an organic-inorganic composite hardmask film or the like. Materials of these hardmask films will be described below in detail.

The substrate W1 is obtained, for example, by a dry etching processing of a material substrate Wo shown in FIG. 6(A). The material substrate Wo has a semiconductor wafer 91, a film to be etched 92', a layer to be processed 93' (hardmask film), and a photoresist film 94 which has been patterned with a predetermined pattern by a photolithography step in order. The film to be etched 92' and layer to be processed 93' have not been patterned into a predetermined pattern yet.

The dry etching processing of the material substrate Wo is performed, for example, as follows. First, as shown in FIG. 6(B), the layer to be processed 93' is subjected to dry etching using the photoresist film 94 as a mask material. Because of this, the pattern of the photoresist film 94 is transferred to the layer to be processed 93', and the layer to be processed 93 patterned into a predetermined pattern is formed.

Next, as shown in FIG. 6(C), the photoresist film 94 is removed by an ashing processing.

Next, as shown in FIG. 6(D), the film to be etched 92' is subjected to dry etching using the layer to be processed 93 as a mask material. Because of this, the film to be etched 92 patterned into a predetermined pattern is formed.

The dry etching processing can be anisotropic etching or isotropic etching. Examples of etching methods used in the dry etching processing include ECR etching, ICP etching, CCP etching, Helicon etching, TCP etching, UHF plasma, SWP etching, and the like.

As shown in FIG. 6(D), a substance P such as a side product generated during etching (e.g. polymers derived from etching gas, the resist film, the hardmask film and the like), or resist residues generated during ashing of the resist film can be attached to the substrate W1.

<<Washing Composition>>

The washing composition is a composition used in a washing method described below. Specifically, the washing composition is used to wash a layer to be processed, formed on a substrate. The washing composition includes a component (A) capable of decomposing a layer to be processed.

A substrate which is processed by the washing composition and a layer to be processed, and essential or optional components included in the washing composition will now be described.

<Substrate>

There is no particular limitation on type of substrate. The substrate may be, for example, a substrate made of an inorganic material, such as a glass substrate or a metal substrate, or may be a resin substrate made of, for example, polyester such as PET, polycarbonate, or polyimide. The substrate is typically a semiconductor substrate such as a silicon substrate.

In addition, on the substrate, various other layers may be formed, in addition to a layer to be processed. Examples of other layers include an insulating layer, a conductive layer made of a conductive material, for example, metals and metal oxides such as ITO, a semiconductor layer, an anti-reflection layer, and the like. Examples of the insulating layer include a $SiO_2$ film, and a low dielectric constant film (Low-k film). Examples of the Low-k film include a SiOC film, a SiCOH film and the like, which are films with a relative dielectric constant lower than that of silicon dioxide.

On the substrate described above, a layer to be processed and, if necessary, other layers are laminated so as to form a desired layer structure.

<Layer to be Processed>

Materials for a layer to be processed are not particularly limited as long as the materials can be decomposed by a component (A). Examples of the layer to be processed include a layer made of a thermosetting cross-linking polymer or the like, and a photoresist film (especially an ion-implanted photoresist film used as a mask material for an ion implantation process), and the layer to be processed is typically a hardmask film. When etching a layer to be etched on a substrate by e.g. microfabrication by a lithography process to form a pattern, a patterned layer made of a material having an etch selectivity ratio which is greatly different from that of the layer to be etched is formed. The layer to be etched is etched using this patterned layer as a mask. A layer that has an etch selectivity ratio which is greatly different from that of the layer to be etched and is used as a mask is referred to as a hardmask. Materials for the hardmask film are not particularly limited, and can be an organic material or an inorganic material.

Examples of materials for an inorganic hardmask film include titanium (Ti), titanium nitride (TiN), silicon oxide ($SiO_2$), silicon nitride ($Si_3N_4$), silicon oxynitride (SiON), silicon nitride (SiN), silicon carbide (SiC), and silicon carbide nitride (SiCN), and the like.

In addition, a silicon-containing material having an organic group is also used as a material for the hardmask film. Examples of such silicon-containing material having an organic group include polycarbosilane, organopolysilazane, organopolysilane, organopolysiloxane, a copolymer of organopolysiloxane and a metal oxide (titanium oxide, aluminum oxide, tungsten oxide), and the like.

Examples of materials for an organic hardmask film (carbon hardmask film) include amorphous carbon and various resin materials. As the resin materials, a resin including an aromatic group, such as a novolak resin or a polyhydroxystyrene resin is preferably used. There has also been known, as a carbon hardmask film made of the resin including an aromatic group, for example, a hardmask film formed using a composition as mentioned in JP 4433933 B1.

Specifically, the composition mentioned in JP 4433933 B1 is a radiation-sensitive composition which includes a copolymer having a repeating unit represented by the following formula (1) and a repeating unit represented by the following formula (2), a radiation-sensitive acid generator and a solvent:

[Chem. 1]

$$\begin{array}{c} R^1 \\ -(C-CH_2)- \\ C=O \\ R^2-O-R^2 \\ R^3 \end{array} \quad (1)$$

wherein, in the formula (1), $R^1$ represents a hydrogen atom or a monovalent organic group (excluding those having an epoxy group), each $R^2$ independently represents a hydrogen atom or a monovalent organic group (excluding those having an epoxy group), and $R^3$ represents a monovalent organic group having an epoxy group:

[Chem. 2]

(2)

wherein, in the formula (2), each $R^4$ independently represents a hydrogen atom or a monovalent organic group (excluding those having an epoxy group).

The hardmask film formed by using such radiation-sensitive composition includes aromatic groups derived from a repeating unit represented by the formula (2) and ester bonds derived from a repeating unit represented by the formula (1). In addition, when epoxy groups represented by $R^3$ included in the repeating unit represented by the formula (1) react with each other, an ether bond can be formed. Thus, the hardmask film may include a polymer having ester bonds and ether bonds.

Furthermore, the hardmask film may include fluorine, chlorine and sulfur elements. For example, a fluorine-containing functional group may be introduced into a material for the hardmask film for various purposes, and when a laminate including the hardmask film is subjected to dry etching using a fluorine-containing gas, the material for the hardmask film may be also fluorinated.

Examples of other materials for the carbon hardmask film include materials mentioned in e.g. JP 5440755 B1, JP 5229044 B1, JP 5920588 B1, WO 2014/014034 A, JP 4639919 B1 and WO 2012/161126 A. The materials mentioned in the respective patent documents will be described below. It should be noted, however, that numbers and abbreviations for e.g. substituents in the general formulas are described using numbers mentioned in the respective patent documents, and thus the numbers may overlap with each other.

JP 5440755 B1 discloses a polymer including a unit structure represented by the following formula (1-1), (1-2), (1-3) or (1-4):

[Chem. 3]

(1-1)

(1-2)

(1-3)

(1-4)

a structural unit represented by the following formula (2) and a structural unit represented by the following formula (3):

[Chem. 4]

$$\begin{array}{c} R_3 \quad R_4 \\ -(C-C)- \\ R_5 \quad M \quad R_6 \\ \phantom{-}C-O-C-O-R_9 \\ \phantom{-}\parallel \quad\quad HC-R_8 \\ \phantom{-}O \quad\quad R_7 \end{array} \quad (2)$$

$$\begin{array}{c} R_{10} \quad R_{11} \\ -(C-C)- \\ R_{12} \\ Q-CH-CH_2 \\ \phantom{Q-}O-(CH_2)_n \end{array} \quad (3)$$

wherein, in the above formulas, $R_3$, $R_4$, $R_5$, $R_{10}$, $R_{11}$ and $R_{12}$ each represent a hydrogen atom, a halogen atom or an alkyl group having 1 to 3 carbon atoms, $R_6$, $R_7$ and $R_8$ each represent a hydrogen atom or a chain or cyclic alkyl group having 1 to 10 carbon atoms, $R_9$ represents a chain or cyclic alkyl group having 1 to 10 carbon atoms or an aromatic group having 6 to 20 carbon atoms, $R_7$ and $R_8$ may be combined with each other to form a ring, M and Q each represent a direct bond or a linking group, and n represents an integer of 0 or 1, wherein, when the total number of all unit structures constituting said polymer is 1.0, the proportion of the number (a) of unit structures represented by the formula (1-1), formula (1-2), formula (1-3) or formula (1-4), the proportion of the number (b) of unit structures represented by the formula (2) and the proportion of the number (c) of unit structures represented by the formula (3) are $0.5 \leq a \leq 0.8$, $0.1 \leq b \leq 0.2$ and $0.1 \leq c \leq 0.3$.

The polymer usable as a carbon hardmask mentioned in JP 5440755 B1 has ester bonds derived from a unit represented by the formula (2). In addition, the unit represented by the formula (3) has an epoxy group (oxiranyl group) or an oxetanyl group, so that the polymer included in the carbon hardmask may have ether bonds by the reaction between these groups. Furthermore, the aromatic rings in the structural units represented by the formulas (1-1) to (1-4) may be also fluorinated by e.g. dry etching using a fluorine-containing gas.

JP 5229044 B1 mentions that it is possible to use, as a carbon hardmask, a polymer formed by using a composition including:
(A) a polymer having an aromatic ring,
(B) a compound represented by the following formula (1):

[Chem. 5]

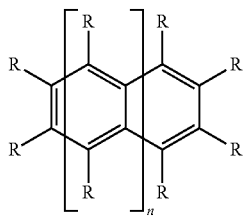

(1)

wherein, in the formula (1), a plurality of R's each independently represent a hydrogen atom, an adamantyl group or a glycidyl ether group, with the proviso that among the plurality of R's one or two substituents are an adamantyl group and one or two substituents are a glycidyl ether group, and n represents an integer of 0 to 3, and
(C) an organic solvent.
JP 5229044 B1 also mentions that it is possible to suitably use a novolak resin as (A) a polymer having an aromatic ring.

The polymer mentioned in JP 5229044 B1 usable as a carbon hardmask has, for example, ether bonds formed by a reaction between a phenolic hydroxy group, and a glycidyl group of the compound represented by the formula (1), when (A) the polymer having an aromatic ring is a novolak resin. Furthermore, (A) the polymer having an aromatic ring, and the aromatic ring derived from the compound represented by the formula (1) may be also fluorinated by e.g. dry etching using a fluorine-containing gas.

JP 5920588 B1 mentions a polymer including a structural unit represented by the following formula (2):

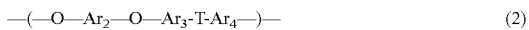

(2)

wherein, in the formula (2), $Ar_2$, $Ar_3$ and $Ar_4$ each represent an organic group including an arylene group having 6 to 50 carbon atoms, and T represents a carbonyl group, or a combination of a structural unit represented by the following formula (1):

(1)

wherein, in the formula (1), $Ar_1$ represents an arylene group having 6 to 50 carbon atoms or an organic group including a heterocyclic group, and the structural unit represented by the above formula (2).

The polymer mentioned in JP 5229044 B1 usable as a carbon hardmask is an aromatic polyether and thus inevitably has ether bonds. Furthermore, the aromatic rings included in the polymer mentioned in JP 5229044 B1 may be also fluorinated by e.g. dry etching using a fluorine-containing gas.

WO 2014/014034 A mentions a polymer formed by using a composition which includes a resin including an aromatic ring, and a crosslinking agent having a partial structure represented by the following formula (i):

(i)

wherein, in the formula (i), X is a carbonyl group or a sulfonyl group, Q is a monovalent heteroaromatic group or $-OR^1$, R1 is a monovalent organic group having 1 to 30 carbon atoms, Ar is an aromatic hydrocarbon group or a heteroaromatic group, n is an integer of 1 to 8, and when n is 2 or more, a plurality of X's and Q's may be the same or different.

WO 2014/014034 A mentions, as specific examples of the resin including an aromatic ring, a novolak resin, a polyarylene-based resin such as a polyarylene ether and the like, and discloses, as specific examples of the crosslinking agent, compounds having the following structures. A polymer produced by crosslinking a novolak resin with a crosslinking agent having a structure shown below includes ester bonds. A polymer produced by crosslinking a polyarylene ether with a crosslinking agent having a structure shown below includes ether bonds and ester bonds. When using a crosslinking agent including a 1,1,1,3,3,3-hexafluoropropan-2-yl group, a polymer produced can include fluorine atoms. Furthermore, the aromatic rings included in the polymer mentioned in WO 2014/014034 A may be also fluorinated by e.g. dry etching using a fluorine-containing gas.

[Chem. 6]

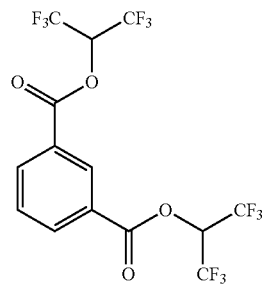

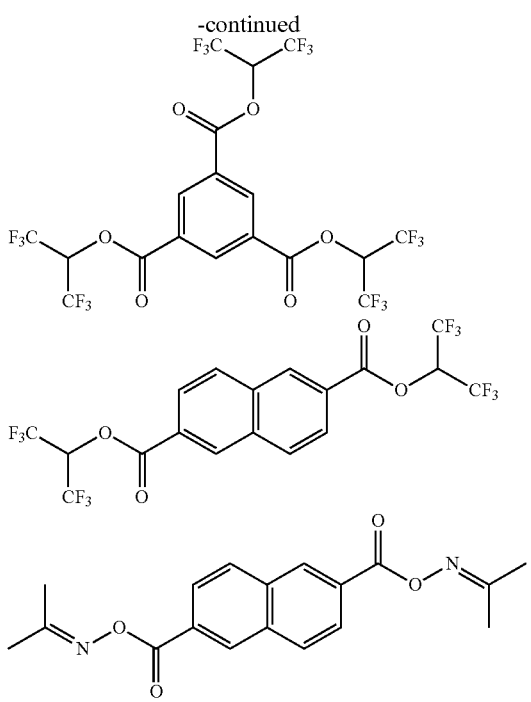

JP 4639919 B1 mentions use of a film formed by using a composition which includes a polymer having a structural unit represented by the following formulas (4) to (6):

[Chem. 7]

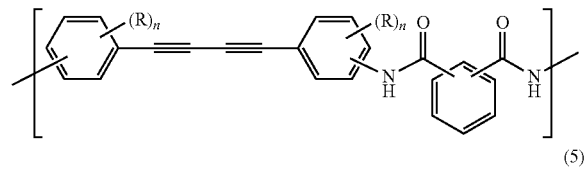
(4)

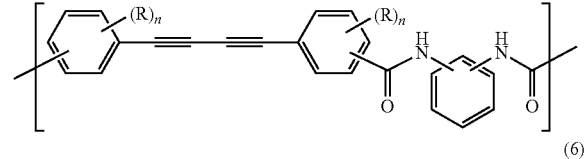
(5)

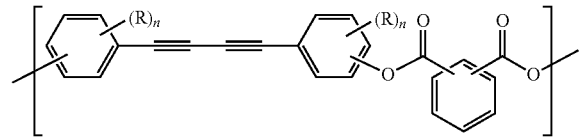
(6)

wherein, in the formulas (4) to (6), R represents a methyl group and n represents an integer of 0 or 1, as a hardmask film (see paragraphs [0035] to [0037]).

In addition, JP 4639919 B1 mentions that the composition may include, in addition to the above-mentioned polymer, various resins such as polyethers, polyamides, polyesters and polyimides (see paragraphs [0063] to [0065]). In other words, a hardmask film formed by using the composition mentioned in JP 4639919 B1 can include not only amide bonds and ester bonds derived from the structural units represented by the formulas (4) to (6) but also ether bonds, amide bonds, ester bonds and imide bonds derived from a binder resin. Furthermore, the aromatic rings included in a hardmask film formed by using the composition mentioned in JP 4639919 B1 may be also fluorinated by e.g. dry etching using a fluorine-containing gas.

WO 2012/161126 A mentions, as a polymer usable as a carbon hardmask, a carbon hardmask film formed by using a composition which includes a polymer (A) including a structural unit represented by the following formula (1) and a structural unit represented by the following formula (2):

[Chem. 8]

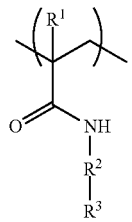
(1)

(2)

wherein, in the formula (1), $R^1$ represents a hydrogen atom or a methyl group, $R^2$ represents an alkylene group having 1 to 3 carbon atoms or an optionally substituted phenylene group, and $R^3$ represents a hydroxy group or a carboxy group, wherein, in the formula (2), $R^4$ represents a hydrogen atom or a methyl group, Y represents a linking group represented by a —C(=O)—NH— group or a —C(=O)—O— group, X represents a group including a lactone ring, a group including an adamantane ring, or an optionally substituted benzene ring group, an optionally substituted naphthalene ring group or an optionally substituted anthracene ring group, and the carbon atom of the linking group represented by the above Y is combined with a main chain of the polymer, a crosslinkable compound (B) having at least two groups of a blocked isocyanate group, a methylol group or an alkoxymethyl group having 1 to 5 carbon atoms, and a solvent (C).

The polymer included in the hardmask film formed by using the composition mentioned in WO 2012/161126 A has amide bonds derived from a structural unit represented by the formula (1) or a structural unit represented by the formula (2), and ester bonds derived from a structural unit represented by the formula (2).

As mentioned in several aforementioned patent documents, a film formed by using a composition including a polymer having a desired structure and a crosslinking agent is preferably used as a carbon hardmask film. Examples of general crosslinking agents mixed in a composition for forming a carbon hardmask film include a melamine-based crosslinking agent, a substituted urea-based crosslinking agent mentioned in JP 5920588 B1, or oligomers or polymers thereof, and the like. A crosslinking agent having at least two cross-link-forming substituents is preferable, and it is possible to particularly preferably use, as the crosslinking agent, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea or methoxymethylated thiourea, and a compound including a cross-link-forming substituent having an aromatic ring (e.g., benzene ring, naphthalene ring) in the molecule, which is a crosslinking agent having high heat resistance mentioned in paragraph [0035] of JP 5867732 B1.

Examples of such compounds include a compound having a partial structure represented by the following formula (4), and a polymer or oligomer having a repeating unit represented by the following formula (5):

[Chem. 9]

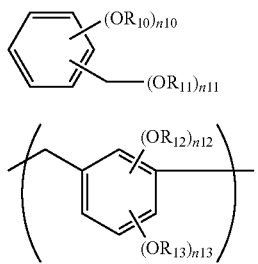

(4)

(5)

In the formula (4), $R_{10}$ and $R_{11}$ each represent a hydrogen atom, an alkyl group having 1 to 10 carbon atoms, or an aryl group having 6 to 20 carbon atoms, n10 represents an integer of 1 to 4, n11 represents an integer of 1 to (5−n10), and (n10+n11) represents an integer of 2 to 5. In the formula (5), $R_{12}$ represents a hydrogen atom or an alkyl group having 1 to 10 carbon atoms, $R_{13}$ represents an alkyl group having 1 to 10 carbon atoms, n12 represents an integer of 1 to 4, n13 represents 0 to (4−n12), and (n12+n13) represents an integer of 1 to 4. The oligomer and polymer can be used in a range where the number of the repeating unit structures is 2 to 100, or 2 to 50.

In order that a hardmask film and a photoresist film made of the above-described materials can be removed well, a component (A) capable of decomposing a layer to be processed described below is properly selected.

<Component (A) Capable of Decomposing Layer to be Processed>

The type of component (A) capable of decomposing a layer to be processed (hereinafter, also referred to as component (A)) is properly selected depending on materials for the layer to be processed and is not particularly limited as long as the component is not significantly decomposed by heating when vaporized. Here, the decomposition of a layer to be processed includes not only cleaving a chemical bond such as a covalent bond in a molecule of a material constituting the layer to be processed but also a reaction of the layer to be processed with a component (A) to an extent in which the layer to be processed can be easily washed and removed by e.g. a removal solution. In modification of the layer to be processed by such reaction, for example, solubilization of the layer to be processed in a removal solution is included. Typically, the component (A) is properly selected from a basic compound (A1), an acidic compound (A2), an oxidizing agent (A3), and a reducing agent (A4) and the like. Among these components (A), the acidic compounds (A2) are preferable, for example, because they have good washing performance and it is easy to vaporize most of the substances. It should be noted that two or more compounds selected from a basic compound (A1), an acidic compound (A2), an oxidizing agent (A3), and a reducing agent (A4) and the like can be used in combination without losing a washing effect.

The component (A) is preferably at least one selected from the group consisting of a basic compound (A1) and an acidic compound (A2) from the viewpoint that it is easy to decompose various materials well.

(Basic Compound (A1))

The basic compound (A1) is preferably used as the component (A), for example when washing a layer to be processed including a material having a bond which can be cleaved in the presence of a base, such as an ester bond (—CO—O—), a carbonate bond (—CO—O—CO—), an amide bond (—CO—NH—), or a urethane bond (—NH—CO—NH—). The type of basic compound (A1) is not particularly limited as long as a layer to be processed can be decomposed, and the basic compound (A1) can be an organic base or an inorganic base.

Examples of the organic base include amines such as ethylamine, n-propylamine, ethanolamine, diethylamine, di-n-propylamine, diethanolamine, triethylamine, methyldiethylamine, dimethylethanolamine, and triethanolamine; cyclic basic compounds such as pyrrole, piperidine, 1,8-diazabicyclo[5,4,0]-7-undecene, and 1,5-diazabicyclo[4,3,0]-5-nonane, and the like.

(Acidic Compound (A2))

The acidic compound (A2) is preferably used as the component (A), for example when washing a layer to be processed including a material having a bond which can be cleaved in the presence of an acid, such as an ester bond (—CO—O—), a carbonate bond (—CO—O—CO—), an amide bond (—CO—NH—), or a urethane bond (—NH—CO—NH—). The type of acidic compound (A2) is not particularly limited as long as a layer to be processed can be decomposed, and the acidic compound (A2) can be an organic acid or an inorganic acid.

Suitable examples of the organic acid include aliphatic carboxylic acids (e.g. acetic acid, propionic acid), fluorinated aliphatic carboxylic acids (e.g. trifluoroacetic acid, etc.), alkanesulfonic acids (e.g. methanesulfonic acid, dodecanesulfonic acid, etc.), arylsulfonic acids (e.g. benzenesulfonic acid, p-toluenesulfonic acid, etc.), fluorinated alkylsulfonic acids (e.g. trifluoromethanesulfonic acid, pentafluoroethanesulfonic acid, heptafluoropropanesulfonic acid, nonafluorobutanesulfonic acid, undecafluoropentanesulfonic acid and tridecafluorohexanesulfonic acid) and the like. The number of carbon atoms in an organic acid is not particularly limited, and is preferably 1 to 30, and more preferably 1 to 10.

Suitable examples of the inorganic acid include hydrochloric acid (hydrogen chloride), hydrobromic acid, hydroiodic acid, hydrofluoric acid, nitric acid, sulfuric acid, phosphoric acid and the like.

Among the acidic compounds (A2) described above, nitric acid and sulfonic acid are preferred from the viewpoint of washing performance. Suitable examples of sulfonic acid include the above-described alkane sulfonic acids, aryl sulfonic acids and fluorinated alkyl sulfonic acids, and a fluorinated alkyl sulfonic acid is more preferred.

In addition, among the acidic compounds (A2), Lewis acids showing Lewis acidity can cleave an ether bond well. In addition, hydrogen halides such as hydrobromic acid and hydroiodic acid can be also used to cleave an ether bond. Hydrogen halides such as hydrobromic acid and hydroiodic acid, and acidic compounds (A2) showing Lewis acidity are preferably used when washing a layer to be processed including a material having ether bonds. Suitable examples of such Lewis acids include the above-described fluorinated alkyl sulfonic acids. The fluorinated alkyl sulfonic acid is preferably at least one selected from the group consisting of trifluoromethanesulfonic acid, pentafluoroethanesulfonic acid, heptafluoropropanesulfonic acid, and nonafluorobutanesulfonic acid.

These fluorinated alkyl sulfonic acids have an excellent affinity (wettability) for a hardmask film, particularly a hardmask film including elemental fluorine. Because of this, when using a fluorinated alkyl sulfonic acid, it is easy to wash and remove a hardmask film, particularly a hardmask film including elemental fluorine well.

(Oxidizing Agent (A3))

The oxidizing agent (A3) is preferably used as the component (A), for example when washing a layer to be processed made of a material having a bond which is easily cleaved by an oxidizing agent, such as a —CO—NH—NH—CO— bond, and a layer to be processed which is an inorganic hardmask film. Examples of the oxidizing agent which can be used as the component (A3) include peroxides, periodic acid, periodates, permanganates, vanadates, hypochlorites, iron oxides, ozone and the like. Specific examples of peroxides include hydrogen peroxide, peracetic acid, peroxybenzoic acid, m-chloroperoxybenzoic acid, urea hydrogen peroxide, and perchloric acid.

(Reducing Agent (A4))

The reducing agent (A4) is preferably used as the component (A), for example when washing a layer to be processed including a material having a bond which is easily cleaved by a reducing agent, such as a disulfide bond. Examples of the reducing agent which can be used as the component (A) include hydrazine compounds such as hydrazine; aldehydes; alcohols; amines; and the like.

The amount of component (A) included in a washing agent composition is not particularly limited as long as a layer to be processed can be removed to a desired extent on desired washing conditions. In addition, the amount of component (A) included is properly adjusted to an appropriate amount depending on the types of component (A). Typically, the amount of component (A) included in a washing agent composition is preferably 5 to 150 mass %, more preferably 30 to 130 mass % and particularly preferably 90 to 120 mass % with respect to the mass of polymer solution (the total sum of the mass of polymer (B) and the mass of solvent).

<Polymer (B)>

The washing composition may include a polymer (B) (hereinafter, referred to as component (B)). In a case where the washing composition includes a polymer (B), even when the bumping of the washing composition occurs during generating a vapor of the component (A) by heating the washing composition, the washing device is not easily contaminated over a wide area by a washing solution.

Naturally it is preferred that the polymer (B) have resistance to the component (A).

The type of polymer (B) is not particularly limited as long as a uniform washing composition can be prepared. Suitable examples of the polymer (B) include at least one selected from the group consisting of a polymer having a constitutional unit derived from (meth)acrylic acid, a polymer having a constitutional unit derived from a vinyl group-containing compound, and a polysaccharide.

(Polymer having Constitutional Unit Derived from (Meth) Acrylic Acid)

The polymer having a constitutional unit derived from (meth)acrylic acid can be a homopolymer of (meth)acrylic acid or a copolymer of (meth)acrylic acid and another monomer. The polymer having a constitutional unit derived from (meth)acrylic acid is highly resistant to a component (A), but is highly resistant to an acidic compound (A2) and can form a salt with a basic compound (A1), and thus is preferably used together with an acidic compound (A2).

Suitable examples of monomers which may be copolymerized with (meth)acrylic acid include unsaturated carboxylic acids other than (meth)acrylic acid, (meth)acrylic acid esters, (meth)acrylamides, allyl compounds, and styrenes and the like.

Examples of unsaturated carboxylic acids other than (meth)acrylic acid include (meth)acrylic acid amide, crotonic acid, maleic acid, fumaric acid, citraconic acid, mesaconic acid, itaconic acid and the like.

Examples of (meth)acrylic acid esters include straight or branched alkyl (meth)acrylates such as methyl (meth)acrylate, ethyl (meth)acrylate, propyl (meth)acrylate, amyl (meth)acrylate, and t-octyl (meth)acrylate; chloroethyl (meth)acrylate, 2,2-dimethyl hydroxypropyl (meth)acrylate, 2-hydroxy ethyl (meth)acrylate, trimethylolpropane mono (meth)acrylate, benzyl (meth)acrylate, furfuryl (meth)acrylate; and (meth)acrylic acid esters having a group having an alicyclic skeleton. In the (meth)acrylic acid esters having a group having an alicyclic skeleton, an alicyclic group constituting an alicyclic skeleton can be monocyclic or polycyclic. Examples of monoalicyclic groups include a cyclopentyl group, a cyclohexyl group and the like. In addition, examples of polyalicyclic groups include a norbornyl group, an isobornyl group, a tricyclononyl group, a tricyclodecyl group, a tetracyclododecyl group and the like.

Examples of (meth)acrylamides include (meth)acrylamide, N-alkyl (meth)acrylamide, N-aryl (meth)acrylamide, N,N-dialkyl (meth)acrylamide, N,N-aryl (meth)acrylamide, N-methyl-N-phenyl (meth) acrylamide, N-hydroxyethyl-N-methyl (meth) acrylamide and the like.

Examples of allyl compounds include allyl esters such as allyl acetate, allyl caproate, allyl caprylate, allyl laurate, allyl palmitate, allyl stearate, allyl benzoate, allyl acetoacetate, and allyl lactate; allyloxyethanol; and the like.

Examples of styrenes include styrene; alkylstyrenes such as methylstyrene, dimetylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene; alkoxystyrenes such as methoxystyrene, 4-methoxy-3-methylstyrene, and dimethoxystyrene; halostyrenes such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene; and the like.

The amount of constitutional unit derived from (meth) acrylic acid included in a polymer having a constitutional unit derived from (meth)acrylic acid is preferably 70 mol % or more, more preferably 80 mol % or more, particularly preferably 90 mol % or more, and most preferably 100 mol %. That is, polymethacrylic acid, and polyacrylic acid are most preferred.

(Polymer having Constitutional Unit Derived from Vinyl Group-Containing Compound)

The polymer having a constitutional unit derived from a vinyl group-containing compound can be a homopolymer of a vinyl group-containing compound, or a copolymer of a vinyl group-containing compound and another monomer. It should be noted that (meth)acrylic acid or derivatives thereof are not included in the vinyl group-containing compound.

Examples of the vinyl group-containing compound include N-vinylcarboxylic acid amides, vinylethers, vinyl esters, and acid group-containing vinyl compounds and the like.

Examples of N-vinylcarboxylic acid amides include N-vinylacetamide, N-vinylpropionamide, N-vinylbenzoic acid amide and the like.

Examples of vinylethers include aliphatic vinylethers such as hexyl vinylether, octyl vinylether, decyl vinylether, ethylhexyl vinylether, methoxyethyl vinylether, ethoxyethyl vinylether, chloroethyl vinylether, 1-methyl-2,2-dimethylpropyl vinylether, 2-ethylbutyl vinylether, hydroxyethyl vinylether, diethylene glycol vinylether, dimethyl aminoethyl vinylether, diethyl aminoethyl vinylether, butyl aminoethyl vinylether, benzyl vinylether, and tetrahydrofurfuryl vinylether; vinyl aryl ethers such as vinyl phenyl ether, vinyl tolyl ether, vinyl chlorophenyl ether, vinyl-2,4-dichlorophenyl ether, vinyl naphthyl ether, and vinyl anthranyl ether; and the like.

Examples of vinyl esters include vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenyl butyrate, vinyl benzoate, vinyl salicylate, vinyl chlorobenzoate, vinyl tetrachlorobenzoate, vinyl naphthoate and the like.

Examples of acid group-containing vinyl compounds include vinylsulfonic acid, vinylphosphonic acid and the like.

Among the above-mentioned vinyl group-containing compounds, N-vinylcarboxylic acid amides, and acid group-containing vinyl compounds are preferred, N-vinylacetamide, N-vinylpropionamide, vinylsulfonic acid, and vinylphosphonic acid are more preferred, and N-vinylacetamide, vinylsulfonic acid, and vinylphosphonic acid are particularly preferred from the viewpoint of e.g. easy availability and resistance to a component (A).

Suitable examples of monomers which may be copolymerized with a vinyl group-containing compound include unsaturated carboxylic acids other than (meth)acrylic acid, (meth)acrylic acid esters, (meth)acrylamides, allyl compounds, and styrenes and the like. Suitable examples thereof are as described above. It should be noted that a copolymer of monomers including (meth)acrylic acid and a vinyl group-containing compound can be also used as the component (B).

The amount of constitutional unit derived from a vinyl group-containing compound included in a polymer having a constitutional unit derived from a vinyl group-containing compound is preferably 70 mol % or more, more preferably 80 mol % or more, particularly preferably 90 mol % or more, and most preferably 100 mol %. Examples of particularly preferred polymers as the polymer having a constitutional unit derived from a vinyl group-containing compound include poly(N-vinylacetamide), polyvinylsulfonic acid, and polyvinylphosphonic acid. Poly(N-vinylacetamide) is highly resistant to a component (A) but is particularly highly resistant to a basic compound (A1), and thus is preferably used together with a basic compound (A1). Polyvinylsulfonic acid, and polyvinylphosphonic acid are highly resistant to a component (A), but are highly resistant to an acidic compound (A2) and can form a salt with a basic compound (A1), and thus are preferably used together with an acidic compound (A2).

(Polysaccharide)

Examples of the polysaccharide include starches, celluloses, agarose, xanthan gum, guar gum, glucomannan, curdlan, carrageenan, xanthan gum, gellan gum, dextran, locust bean gum, alginic acids, and hyaluronic acids, and the like.

The molecular weight of the component (B) described above is not particularly limited. The molecular weight of the component (B) is preferably 50,000 to 2,000,000, and more preferably 100,000 to 1,250,000 for example as a mass average molecular weight (Mw) in terms of polystyrene.

The amount of component (B) included in a washing composition is not particularly limited without defeating the object of the present invention. The amount of component (B) used is preferably 1 to 30 mass %, more preferably 2 to 20 mass %, and particularly preferably 3 to 15 mass % with respect to the mass of polymer solution (the total sum of the mass of component (B) and the mass of solvent).

<Solvent>

The washing composition is preferably in a liquid form at a temperature around room temperature, about 0 to 40° C., from the viewpoint of handling properties. Because of this, the washing composition may include a solvent. It should be noted that when a basic compound (A1) and an acidic compound (A2) are in a liquid form at a temperature around room temperature, about 0 to 40° C., a washing composition in a liquid form at a temperature around the room temperature can be prepared without using a solvent. Such solvent is preferably at least one selected from the group consisting of water and an organic solvent.

When the boiling point of a solvent is lower than the boiling point of the component (A), for example, a vapor of the component (A) can be supplied to a substrate to be washed by heating a washing composition to a temperature equal to or higher than the boiling point of the component (A) at atmospheric pressure in a sealed pressure resistant container, and then opening a valve attached to the pressure resistant container.

Because a layer to be processed is decomposed by a hydrolytic reaction which is allowed to proceed by the component (A) in many cases, the solvent may include water. When the solvent is an aqueous solvent, the amount of water included in the solvent is preferably 50 mass % or more, more preferably 70 mass % or more and particularly preferably 90 mass % or more.

Specific examples of organic solvents which can be used as a solvent include: sulfoxides such as dimethyl sulfoxide; sulfones such as dimethylsulfone, diethylsulfone, bis(2-hydroxyethyl)sulfone, and tetramethylenesulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; polyalcohols such as ethylene glycol, propylene glycol, 1,2-butylene glycol, 1,3-butylene glycol, 2,3-butylene glycol, glycerin, and diethylene glycol; dialkyl glycol ethers such as dimethyl glycol, dimethyl diglycol, dimethyl triglycol, methyl ethyl diglycol, diethyl glycol, diethyl diglycol, triethylene glycol butyl methyl ether, and tetraethylene glycol dimethyl ether; (poly)alkylene glycol monoalkyl ethers such as ethylene glycol monomethyl ether, ethylene glycol monoethyl ether, ethylene glycol mono-n- propyl ether, ethylene glycol mono-n-butyl ether, ethylene glycol monoallyl ether, diethylene glycol monomethyl ether, diethylene glycol monoethyl ether, diethylene glycol mono-n-propyl ether, diethylene glycol mono-n-butyl ether, diethylene glycol monobenzyl ether, triethylene glycol monomethyl ether, triethylene glycol monoethyl ether, triethylene glycol mono-n-propyl ether, triethylene glycol mono-n-butyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tripropylene glycol mono-n-propyl ether, tripropylene glycol monobutyl-n-ether, tripropylene glycol mono-n-butyl ether, and 3-methoxy-3-methyl-1-butanol; (poly)alkylene glycol esters such as ethylene glycol monoacetate, propylene glycol monoacetate, diethylene glycol monoacetate, and dipropylene glycol monoacetate; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, and propylene glycol monoethyl ether acetate; other ethers such as dimethyl ether, diethyl ether, methylethyl ether, dipropyl ether, diisopropyl ether, dibutyl ether, diisoamyl ether, diethylene glycol dimethyl ether, diethylene glycol methylethyl ether, diethylene glycol diethyl ether, and tetrahydrofuran; ketones such as methylethyl ketone, cyclohexanone, 2-heptanone, and 3-heptanone; alkyl lactic acid esters such as methyl 2-hydroxypropionate, and ethyl 2-hydroxypropionate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate; lactones such as β-propiolactone, γ-butyrolactone and δ-pentyrolactone; straight, branched or cyclic aliphatic hydrocarbons such as n-hexane, n-heptane, n-octane, n-nonane, methyloctane, n-decane, n-undecane, n-dodecane, 2,2,4,6,6-pentamethyl heptane, 2,2,4,4,6,8,8-heptamethyl nonane, cyclohexane, and methylcyclohexane; aromatic hydrocarbons such as benzene, toluene, xylene, 1,3,5-trimethylbenzene, and naphthalene; terpenes such as p-menthane, diphenyl menthane, limonene, terpinene, bornane, norbornane, and pinane; and the like.

<Other Components>

The washing composition may include, in addition to the above-mentioned components, various additives without defeating the object of the present invention. Examples of such additives include an antioxidant, an ultraviolet absorbing agent, a surface-active agent, a pH adjuster, and a metal corrosion inhibitor, and the like.

<Method for Manufacturing Washing Composition>

The washing composition can be prepared by uniformly mixing the components described above in respective desired amounts. To remove molten residue and insoluble impurities during preparation, the washing composition may be filtered through a filter as needed.

<<Washing Method>>

In the washing method, a layer to be processed is removed in a substrate with the layer to be processed. The layer to be processed is as described above in relation to the washing composition. The washing method includes a heating step, a reaction processing step and a removal step. In the heating step, a substrate with a layer to be processed is heated. In the reaction processing step, the layer to be processed and a component (A) are allowed to react. In the removal step, the layer to be processed which has reacted with the component (A) is removed from the substrate. Each step included in the washing method will now be described.

<Heating Step>

In the heating step, a substrate with a layer to be processed is heated. The heating temperature is not particularly limited as long as excessive damage to the substrate is not caused and the above-described heat decomposition of the component (A) is not caused. In the heating step, it is preferred to heat the substrate to a temperature, which is the boiling point of the component (A)—10° C. or higher. It should be noted that the boiling point of the component (A) is a boiling point at a pressure around the substrate when the layer to be processed and component (A) are allowed to react. Because of this, when the substrate is heated to a temperature, which is the boiling point of the component (A)—10° C. or higher, the component (A) is easily brought into contact with the layer to be processed as vapor. In this case, the temperature of the substrate may be the boiling point of the component (A)—10° C. or higher and less than the boiling point, or may be the boiling point of the component (A) or higher. The temperature of the heated substrate is preferably 500° C. or lower, more preferably 450° C. or lower, and particularly preferably 400° C. or lower because the component (A) is not easily decomposed and excessive energy consumption is limited.

When the substrate is heated to the boiling point of the component (A)—10° C. or higher and lower than the boiling point, preferably the boiling point—10° C. or higher and lower than the boiling point—8° C., and more preferably the boiling point—10° C. or higher and lower than the boiling point—5° C., a vapor of the component (A) supplied to the substrate with a layer to be processed is condensed on the surface of the layer to be processed to provide liquid droplets. The high temperature liquid droplets of the component (A) generated on the surface of the layer to be processed have a higher amount of component (A) than that of the vapor of the component (A) in the same volume. In addition, because it is not always that the vapor of the component (A) is not brought into contact with the surface of the layer to be processed at all under this condition, the decomposition of the layer to be processed also proceeds by the vapor of the component (A). Because of this, the layer to be processed is decomposed well.

In addition, the temperature of the substrate may be the boiling point of the component (A) or higher. In this case, the layer to be processed is decomposed well by contact of the layer to be processed and the component (A) at a high temperature.

The method for heating a substrate is not particularly limited. Examples of methods for heating a substrate include a method for heating a substrate in a non-contact manner by an external heating device such as an infrared heater, a method for heating a substrate by setting the substrate on a heating table, and the like. In addition, a substrate may be heated to a predetermined temperature by allowing a high temperature gas to pass through a room in which the substrate is set. In this case, examples of the high temperature gas include an inert gas which does not react with a substrate and a layer to be processed, a mixed gas of a vapor of the component (A) and an inert gas, the vapor of the component (A) and the like. When a substrate is heated using a heated vapor of the component (A), it is understood that the heating step and the reaction processing step described below are continuously performed. Because it is easy to quickly heat a whole substrate to a uniform temperature, the method for heating a substrate by setting it on a heating table is preferred.

<Reaction Processing Step>

In the reaction processing step, the vapor of the component (A) capable of decomposing the layer to be processed is supplied to the heated substrate to allow the layer to be processed and the component (A) to react. It should be noted that two or more selected from basic compounds (A1), acidic compounds (A2), oxidizing agents (A3) and reducing agents (A4) and the like can be used in combination as the component (A). Among these, an acidic compound (A2) is preferred.

Among acidic compounds (A2), nitric acid and sulfonic acid are preferred from the viewpoint of washing performance. Suitable examples of sulfonic acid include the above-described alkanesulfonic acids, arylsulfonic acids and fluorinated alkyl sulfonic acids, and a fluorinated alkyl sulfonic acid is more preferred. The fluorinated alkyl sulfonic acid is preferably at least one selected from the group consisting of trifluoromethanesulfonic acid, pentafluoroethanesulfonic acid, heptafluoropropanesulfonic acid, and nonafluorobutanesulfonic acid.

Because the vapor of the component (A) can be prevented from diffusing to the outside and the temperature of the vapor of the component (A) is easily maintained at a desired temperature, it is preferred that a reaction of the layer to be processed and the component (A) be commonly performed with the substrate set in a sealed processing room.

It is preferred that the amount of substance which can inhibit a reaction of the component (A) and layer to be processed in a processing room be reduced by allowing an auxiliary gas (inert gas) to pass through the processing room or by reducing the pressure in the processing room before introducing the vapor of the component (A) into the processing room. The pressure condition in the processing room is not particularly limited, and is preferably 0 MPa (G) (atmospheric pressure) or more 0.10 MPa (G) or less, more preferably 0 MPa (G) (atmospheric pressure) or more 0.05 MPa (G) or less, and particularly preferably 0 MPa (G) (atmospheric pressure) or more 0.03 MPa (G) or less. In a case where the pressure is reduced, it is also preferred to return the pressure in the processing room to atmospheric pressure or a pressure around the atmospheric pressure by introducing an inert gas into the processing room before introducing the vapor of the component (A).

A vapor of a component (A) is generated by heating a washing composition including the component (A). The washing composition may be a component (A) alone or may include a component (A) and a solvent. The method for generating a vapor of a component (A) is not particularly limited as long as a vapor including a component (A) with a desired temperature can be generated. Typically, after heating a washing composition including a component (A) to a desired temperature of vapor in a sealed pressure resistant container, the vapor of the component (A) with a desired temperature can be supplied into the processing room by opening a valve provided in a pipe connecting the container including the washing composition and the processing room. At this time, it is preferred that the pipe to supply the vapor include an auxiliary heating device to heat the periphery of the pipe so as to prevent the temperature of vapor from being lower than a desired temperature. In addition, it is also preferred that a part of or all the wall surfaces in the processing room be heated by an auxiliary heating device.

The temperature of the vapor supplied to the processing room is not particularly limited, and is preferably the boiling point of a component (A) or higher 500° C. or lower, preferably the boiling point of a component (A) or higher 450° C. or lower, and more preferably the boiling point of a component (A) or higher 400° C. or lower.

In a case where trifluoromethanesulfonic acid is used as the component (A), the temperature of the vapor of trifluoromethanesulfonic acid is preferably the boiling point of trifluoromethanesulfonic acid or higher 200° C. or lower. It should be noted that the boiling point of trifluoromethanesulfonic acid is a boiling point at a pressure around a substrate when the vapor of trifluoromethanesulfonic acid is allowed to react with a layer to be processed.

In the reaction processing step, the time to allow the layer to be processed and the component (A) to react is not particularly limited.

After allowing the layer to be processed and the component (A) to react as described above, a substrate is cooled as needed, and the layer to be processed is then removed by the removal step.

<Removal Step>

In the removal step, the layer to be processed which has reacted with the component (A) is removed from the substrate. It should be noted that the layer to be processed which has reacted with the component (A) is a decomposed product or denatured product of the layer to be processed. The method for removing a layer to be processed which has reacted with a component (A) from a substrate is not particularly limited, and a method for removing the layer by contact of the substrate and a removal solution is preferred because the substrate is not damaged, and a decomposed product or denatured product of the layer to be processed is easily removed. The method for bringing a substrate and a removal solution into contact is not particularly limited. The method may be, for example, immersion or the like, and is preferably a method in which a removal solution is allowed to flow on the surface of a substrate, and more preferably a method in which a removal solution is sprayed on the surface of a substrate because a decomposed product or denatured product of a layer to be processed is easily removed.

The removal solution may be water, an organic solvent, or a mixed liquid including water and an organic solvent. Alkanols with a low boiling point such as methanol, ethanol, isopropanol, and n-butanol, and moreover various organic solvents described above as solvents which can be included in the washing composition can be used as the organic solvent.

In a case where a component (A) includes a basic compound (A1), a small amount of acid may be added to the removal solution, and in a case where a component (A) includes an acidic compound (A2), a small amount of base may be added to the removal solution.

The removal solution may be at a normal temperature or may be heated to a temperature higher than the normal temperature. Removal efficiency can be increased by heating a removal solution to a temperature higher than the normal temperature and supplying it.

The time to wash the surface of a substrate by a removal solution is not particularly limited. A removal operation by a removal solution may be continued until a decomposed product or denatured product of a layer to be processed is removed from the surface of a substrate to a desired extent.

A washed substrate is obtained by removal using a removal solution and then drying the substrate as needed.

<<Washing Device>>

The washing device includes a heating part, a vapor supply part and a removal solution supply part. The heating part heats a substrate with a layer to be processed. The supply part supplies the above-described vapor of a component (A) to the heated substrate. The layer to be processed and the component (A) are allowed to react by supplying the vapor of the component (A), performed by the supply part. The removal solution supply part supplies a removal solution to the substrate to remove the layer to be processed which has reacted with the component (A) from the substrate.

The above-mentioned washing device preferably includes one or more first processing parts and one or more second processing parts which each play different roles. In this case, it is preferred that a processing room including the above-mentioned heating part and vapor supply part be provided in the first processing part, and the removal solution supply part be provided in the second processing part. It is preferred that the first processing part further include an auxiliary gas supply part to supply an auxiliary gas into the processing room. In such washing device, while heating the substrate with the layer to be processed in the first processing part, the vapor is supplied to the substrate from the vapor supply part.

Figure 3:
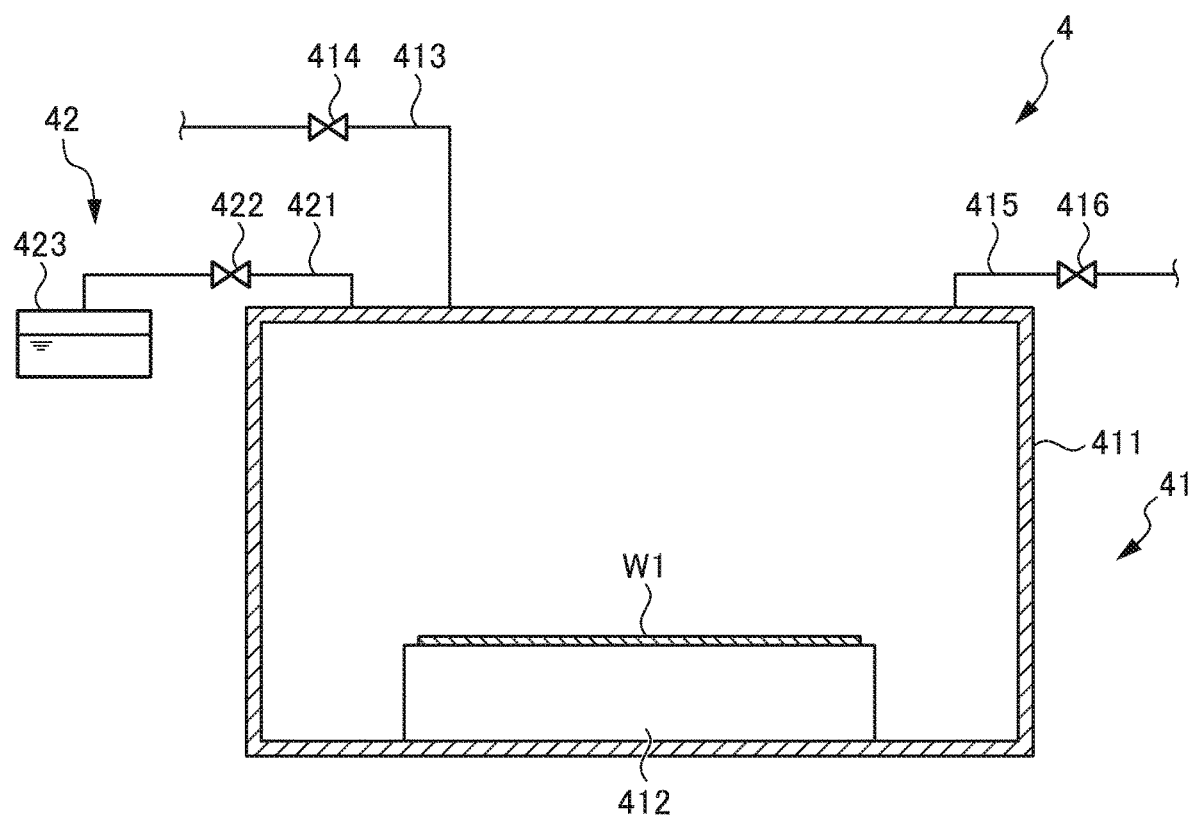
FIG. 3 is a cross-sectional view which shows an outline of the structure of a first processing part in the substrate processing unit shown in FIG. 2.
Figure 4:
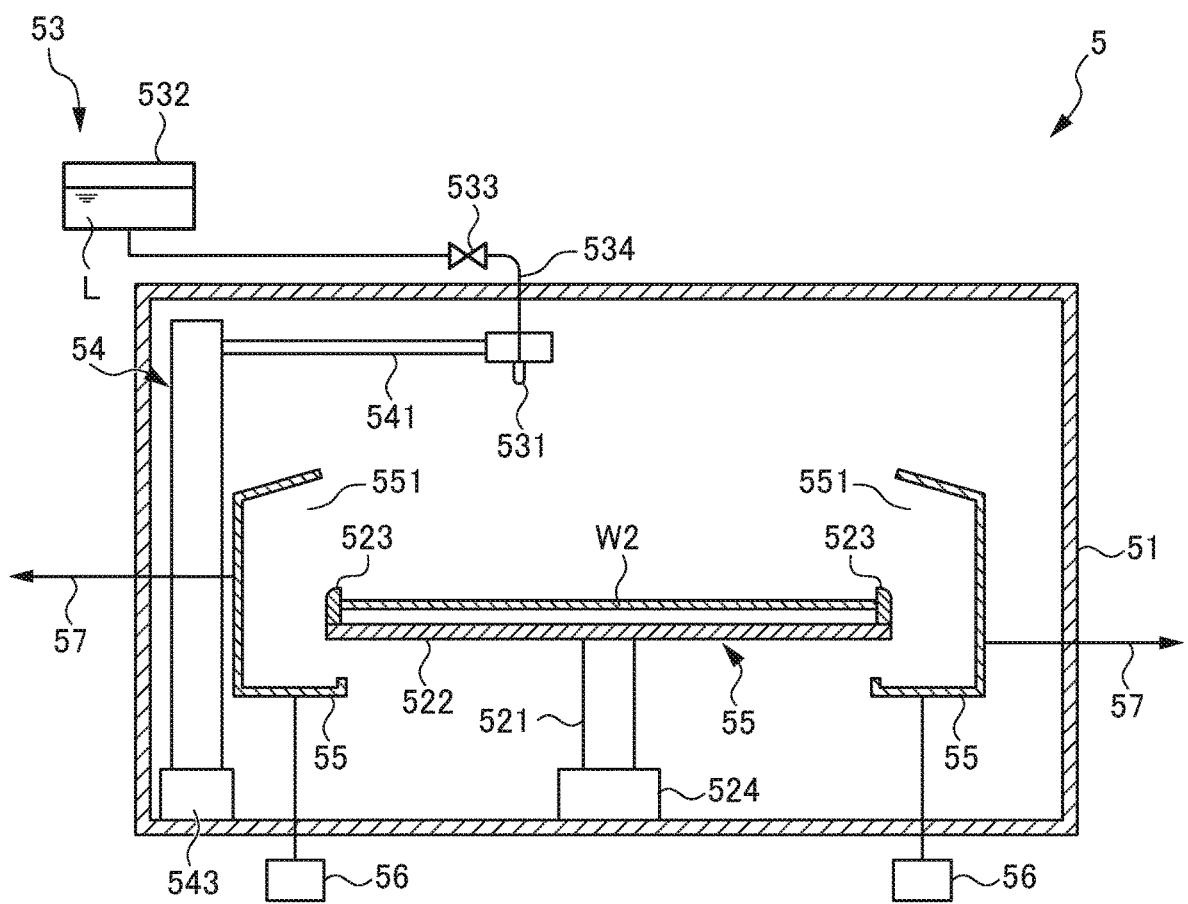
FIG. 4 is a cross-sectional view which shows an outline of the structure of a second processing part in the substrate processing unit shown in FIG. 2.
Figure 5:
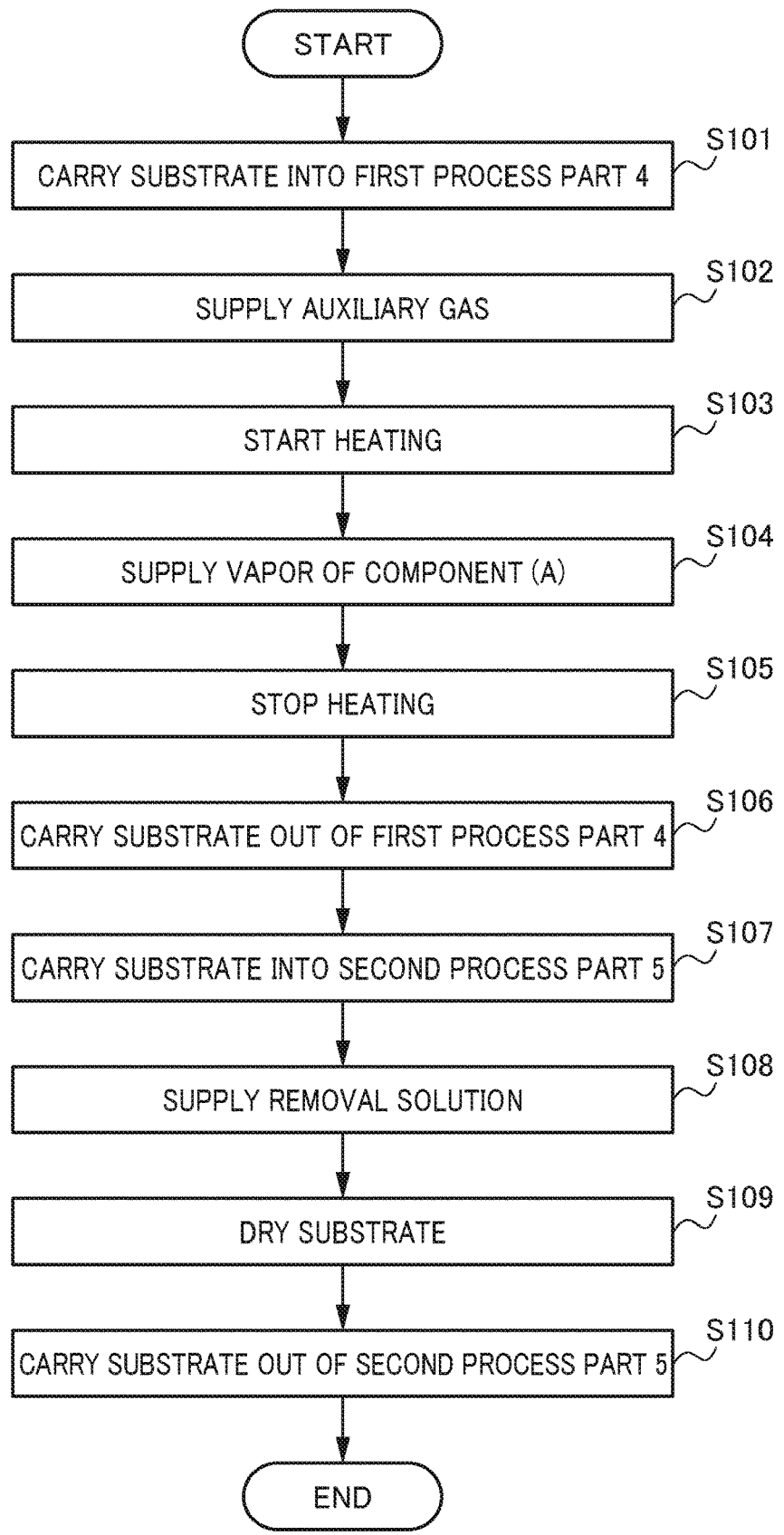
FIG. 5 is a figure which shows a flowchart on control of a washing device to perform a washing method.

A preferred example of such washing device will be described with reference to FIG. 1 to FIG. 5. It should be noted that FIG. 5 is a flowchart on control of a washing device to perform a washing method.

Figure 1:
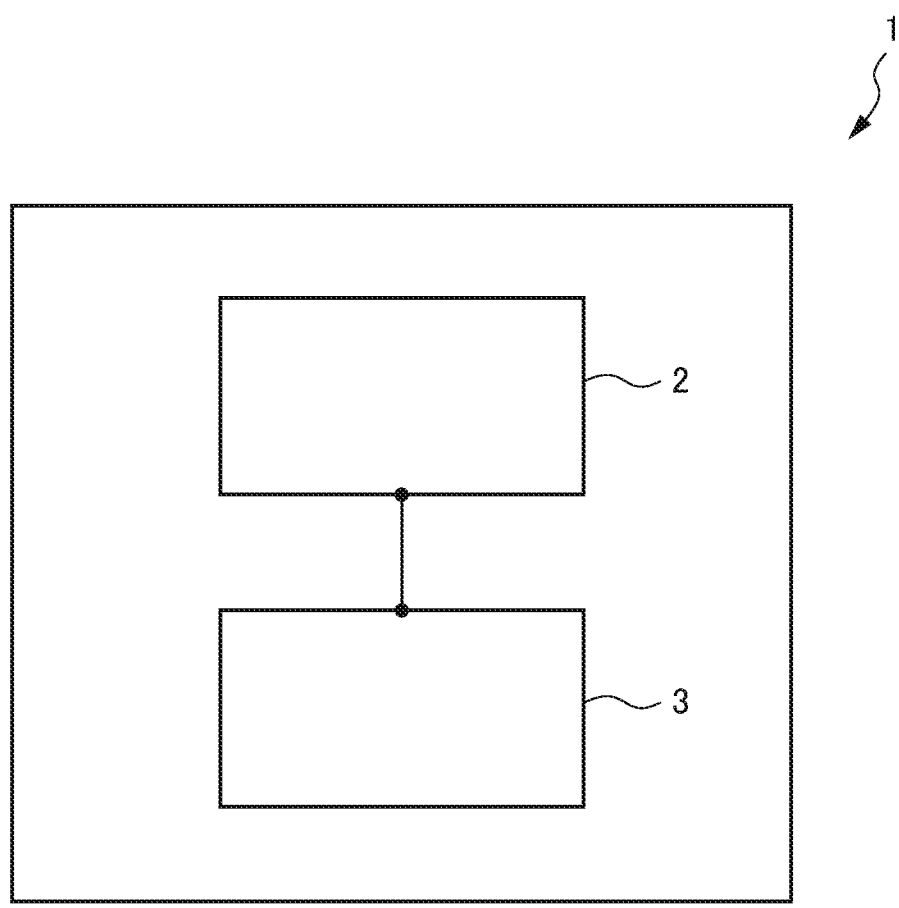
FIG. 1 is a diagram which shows an outline of the structure of a substrate processing device.

First, as shown in FIG. 1, a washing device 1 includes a substrate processing unit 2 to perform a washing operation and a control unit 3 to control the operation of the substrate processing unit 2.

The substrate processing unit 2 performs various processing related to substrate washing. Various processing by the substrate processing unit 2 will be described below.

The control unit 3 is, for example, a computer, and includes a control part and a storage part. The control part is, for example, a CPU (Central Processing Unit), and controls the operation of the substrate processing unit 2 by performing a program stored in the storage part. The storage part is configured by a storage device such as RAM (Random Access Memory), ROM (Read Only Memory), or a hard disk, and stores programs to control various processing performed in the substrate processing unit 2. It should be noted that the programs may be recorded in a machine-readable storage medium or may be installed in the storage part from the storage medium. Examples of machine-readable storage media include a hard disk (HD), a flexible disk (FD), a compact disc (CD), a magneto optical disk (MO), a memory card, and the like. When the operation of the substrate processing device 1 is controlled by a computer, for example, a program to allow the computer to control the substrate processing device 1 and perform a washing method is recorded in the storage medium.

<Structure of Substrate Processing Unit>

Figure 2:
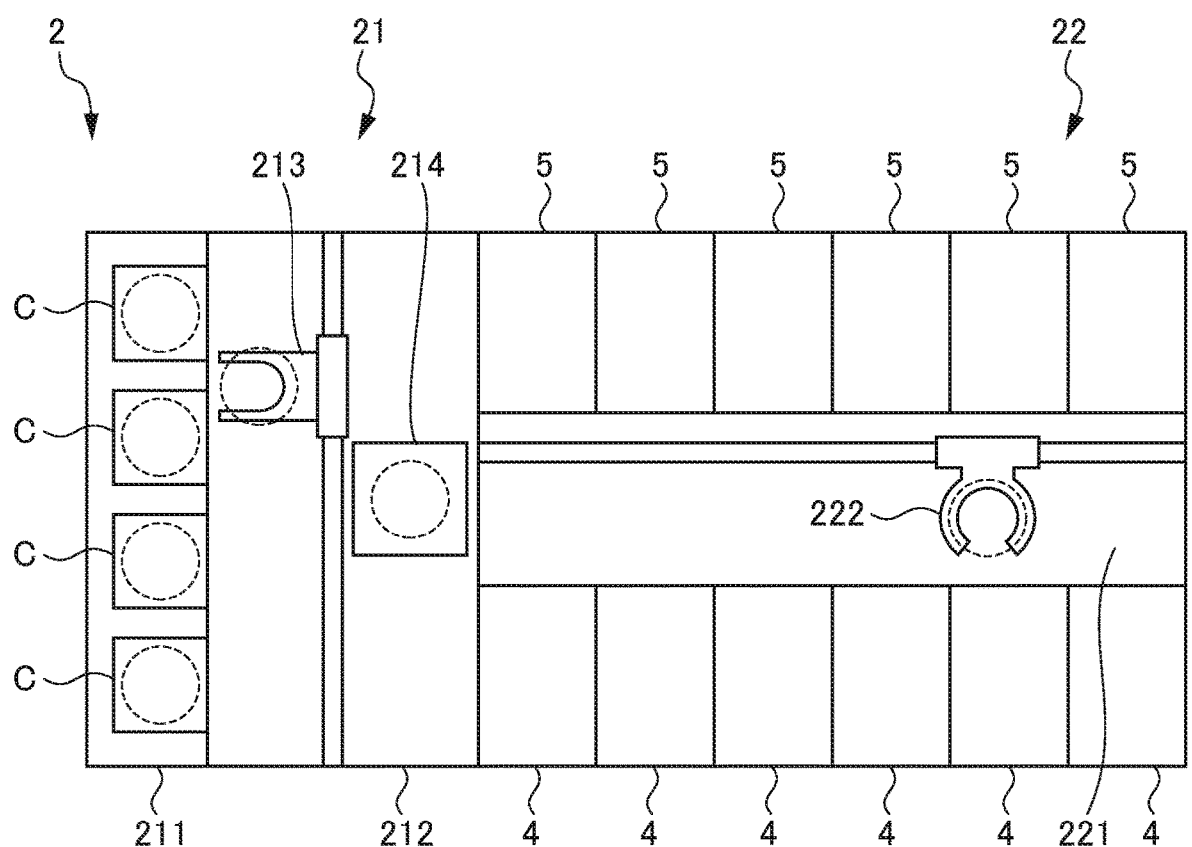
FIG. 2 is a plan view which shows an outline of the structure of a substrate processing unit in the substrate processing device shown in FIG. 1.

The structure of the substrate processing unit will be described with reference to FIG. 2. FIG. 2 is a schematic plan view which shows the structure of the substrate processing unit 2. It should be noted that dotted lines in FIG. 2 indicate a substrate.

The substrate processing unit 2 performs various processing for substrates. The substrate processing unit 2 performs a washing processing to remove a layer to be processed from a substrate with the layer to be processed. Typical examples of substrates are as described above.

The substrate processing unit 2 includes a carrying in/out station 21 and a processing station 22 provided next to the carrying in/out station 21. The carrying in/out station 21 includes a setting part 211 and a carrier part 212 provided next to the setting part 211. In the setting part 211, a plurality of carrier containers (hereinafter, referred to as "carrier C") to store a plurality of substrates in a horizontal state are set.

The carrier part 212 includes a carrier mechanism 213 and a delivery part 214. The carrier mechanism 213 includes a holding mechanism to hold a substrate, and is configured to be able to move in the horizontal and vertical directions and revolve around the vertical axis.

The processing station 22 includes first processing parts 4 to supply a vapor of a component (A) to a substrate, and second processing parts 5 to supply a removal solution to the substrate after a layer to be processed on the substrate and the component (A) are allowed to react in the first processing part 4. In the substrate processing unit 2, "carry substrate into first processing part 4" (S101) in FIG. 5 is performed by the carrying in/out station 21 and the processing station 22. In FIG. 2, the processing station 22 has a plurality of first processing parts 4 and a plurality of second processing parts 5, and the number of first processing parts 4 and the number of second processing parts 5 each may be one in the processing station. In FIG. 2, the first processing parts 4 are arranged on one side of the carrier channel 221 extending in a predetermined direction, and the second processing parts 5 are arranged on the other side. These arrangements are described as an example, and the arrangements of the first processing parts 4 and second processing parts 5 may be optionally determined depending on design and operational reasons and the like.

In the carrier channel 221, the carrier mechanism 222 is provided. The carrier mechanism 222 includes a holding mechanism to hold a substrate, and is configured to be able to move in the horizontal and vertical directions and revolve around the vertical axis.

A substrate before a component (A) is supplied in the first processing part will be referred to as "substrate W1," a substrate after the component (A) has been supplied in the first processing part 4 and before a removal solution is supplied in the second processing part 5 will be referred to as "substrate W2" and a substrate after the removal solution has been supplied in the second processing part 5 will be referred to as "substrate W3."

In the substrate processing unit 2, the carrier mechanism 213 of the carrying in/out station 21 carries the substrate W1 and the substrate W3 between the carrier C and delivery part 214. Specifically, the carrier mechanism 213 takes the substrate W1 out of a carrier C set in the setting part 211, and sets the taken substrate W1 on the delivery part 214. In addition, the carrier mechanism 213 takes the substrate W3 set on the delivery part 214 by the carrier mechanism 222 of the processing station 22, and stores it in a carrier C of the setting part 211.

In the substrate processing unit 2, the carrier mechanism 222 of the processing station 22 carries the substrate W1, substrate W2 and substrate W3 between the delivery part 214 and the first processing part 4, the first processing part 4 and the second processing part 5, and the second processing part 5 and the delivery part 214. Specifically, the carrier mechanism 222 takes the substrate W1 set on the delivery part 214 and carries the taken substrate W1 into the first processing part 4 (S101). In addition, the carrier mechanism 222 takes the substrate W2 out of a first processing part 4 and performs "carry substrate out of first processing part 4" (S106). The carrier mechanism 222 performs "carry substrate into second processing part" (S107) which carries the substrate W2 taken out of the first processing part 4 into a second processing part 5. Furthermore, the carrier mechanism 222 takes the substrate W3 out of the second processing part 5 and performs "carry substrate out of second processing part 5" (S110). Next, the taken substrate W3 is set on the delivery part 214 by the carrier mechanism 222.

<Structure of First Processing Part>

The structure of the first processing part 4 will now be described with reference to FIG. 3. FIG. 3 is a schematic cross-sectional view which shows the structure of the first processing part 4. The first processing part 4 includes a heating part 41 and a vapor supply part 42. In FIG. 3, the heating part 41 includes a processing room 411, a heater 412, an auxiliary gas supply pipe 413 and a valve 414, and an exhaust pipe 415 and a valve 416. The vapor supply part 42 includes a component (A) supply pipe 421, a valve 422, and a washing composition storage container 423. The washing composition storage container 423 includes a heating device (not shown). The washing composition storage container 423 generates the above-described vapor including a component (A) by heating a washing composition in the washing composition storage container using the heating device.

The processing room 411 and the component (A) supply pipe 421 may include an auxiliary heating device for the purpose of easily supplying the vapor including a component (A) into the processing room 411 at a desired temperature. In the processing room 411, when a surface on which the heater 412 is placed is the under surface and a surface opposite to the under surface is the upper surface in FIG. 3, it is preferred that auxiliary heating devices be provided on the upper surface and sides. The auxiliary heating device may be also a cover which forms the above-described upper surface and sides. In addition, a ribbon-shaped heater can be wound around the component (A) supply pipe 421 as the auxiliary heating device.

The processing of the first processing part will now be described.

First, the substrate W1 is carried into the first processing part 4 by the above-described carrier mechanism 222 (S101). The carried substrate W1 is set on the heater 412 in the first processing part. After the substrate W1 is set on the heater 412, "supply auxiliary gas" (S102) is performed by opening the valve 414. It should be noted that, when supplying the auxiliary gas, the valve 422 in the component (A) supply pipe 421 is closed, and the valve 416 in the exhaust pipe 415 is opened. Because of this, an atmosphere in the processing room 411 is replaced with an atmosphere of the auxiliary gas. The auxiliary gas is an inert gas, and the amount of substance which inhibits the reaction of a layer to be processed and a component (A) in the processing room 411 is reduced by supplying the auxiliary gas. After supplying the auxiliary gas for a predetermined time, the valve 414 and the valve 416 are closed, and the supply of auxiliary gas (S102) is stopped.

After the supply of auxiliary gas (S102), "start heating" (S103) is performed on the substrate W1 by the heater 412. It should be noted that the heater 412 may start heating before or after setting the substrate W1 and before or during supplying the auxiliary gas. It should be noted that the heater 412 may be constantly maintained at a high temperature because, for example, the time to increase the temperature of the substrate W1 to a predetermined temperature can be shortened. In this case, "start heating" (S103) and "stop heating" (S105) in the flowchart shown in FIG. 5 are omitted.

It is preferred that a thermometer (not shown) be provided on the surface of the heater 412 on which the substrate W1 is set. In this case, it is preferred that an increase and decrease in heat quantity generated in the heater 412 be controlled so that the temperature of the substrate W1 will be constant based on the temperature data of the substrate W1 obtained by the thermometer.

It should be noted that the substrate W1 may be heated in a non-contact manner by e.g. an infrared heater instead of the heater 412 as described above, or the substrate W1 may be heated by supplying a gas heated to a high temperature to the processing room 411 as described above.

"Supply vapor of component (A)" (S104) is performed by opening the valve 422 in the component (A) supply pipe 421 after the temperature of the substrate W1 reaches a predetermined temperature. At this time, the valve 414 and the valve 416 remain closed. After supplying the vapor of the component (A) into the processing room 411 for a predetermined time the valve 422 is closed, and the supply of the vapor of component (A) (S104) is stopped. After stopping the supply of the vapor of component (A) (S104) "stop heating" (105) is performed by stopping the heater 412. After stopping the supply of the vapor of component (A) (S104) the valve 416 is opened and the vapor of the component (A) in the processing room 411 is released from the exhaust pipe 415. The released vapor of the component (A) is collected by a processing device (not shown) connected to the exhaust pipe 415, and is thrown away after processing of e.g. neutralization has been performed as needed.

As described above, after the layer to be processed on the substrate W1 and the component (A) are allowed to react in the first processing part 4, "carry substrate out of first processing part 4" (S106) and "carry substrate into second processing part 5" (S107) are performed on the substrate W2 by the carrier mechanism 222. It is preferred that before carrying the substrate W2 into the second processing part 5, the substrate W2 be cooled using a cooling device such as a cooling plate (not shown).

<Structure of Second Processing Part>

Next, the structure of the second processing part 5 will be described with reference to FIG. 4. FIG. 4 is a schematic cross-sectional view which shows the structure of the second processing part 5. The second processing part 5 performs processing including "supply removal solution" (S108) for the substrate W2. The processing of the second processing part 5 may include other processing.

The second processing part 5 includes a chamber 51, and the processing of a substrate including removal of the layer to be processed by supplying a removal solution is performed in the chamber 51.

The second processing part 5 includes a substrate holding part 52. The substrate holding part 52 includes a rotation axis 521, a turntable 522, a chuck 523, and a driving part 524. The rotation axis 521 extends in the vertical direction in the chamber 51. The turntable 522 is attached to the upper end of the rotation axis 521. The chuck 523 is provided on the periphery of the upper surface of the turntable 522, and supports the outer edge of the substrate W2. The driving part 524 rotates the rotation axis 521. The substrate holding part 52 can rotate while holding the substrate W2.

The substrate W2 is supported by the chuck 523 and horizontally held to the turntable 522 with the substrate W2 slightly distant from the upper surface of the turntable 522.

The method for holding the substrate W2 by the substrate holding part 52 is a so-called mechanical chuck, in which the outer edge of the substrate W2 is grasped by the movable chuck 523. The holding method may be a so-called vacuum chuck, in which the back surface of the substrate W2 is vacuum-adsorbed.

The base end of the rotation axis 521 is rotatably supported by the driving part 524. The turntable 522 is horizontally supported by the end of the rotation axis 521. When the rotation axis 521 rotates, the turntable 522 attached to the upper end of the rotation axis 521 rotates. Because of this, the substrate W2 held by the turntable 522 with the substrate W2 supported by the chuck 523 rotates. The control part 3 controls e.g. the rotation timing and rotation rate of the substrate W2 by controlling the operation of the driving part 524.

The second processing part 5 includes a removal solution supply part 53 to supply a removal solution L to the substrate W2 held on the substrate holding part 52.

The removal solution supply part 53 includes a nozzle 531 and a removal solution supply source 532. The nozzle 531 discharges the removal solution L to the substrate W2 held on the substrate holding part 52. The removal solution supply source 532 supplies the removal solution L to the nozzle 531. The removal solution L is stored in a tank of the removal solution supply source 532. The removal solution L is supplied from the removal solution supply source 532 to the nozzle 531 through a supply pipe channel 534 in which a flow adjuster such as a valve 533 is inserted. The second processing part 5 may include a plurality of removal solution supply parts which each supply different removal solutions. Additional removal solution supply parts can be configured in the same manner as for the removal solution supply part 53.

The removal solution L is as described above in relation to the washing method.

The second processing part 5 includes a nozzle 531 and a nozzle moving mechanism 54 to drive the nozzle 531. The nozzle moving mechanism 54 has an arm 541, a moving body 542, and a revolving and elevating mechanism 543. The moving body 542 is a device with a built-in driving mechanism, which is movable along the arm 541. The revolving and elevating mechanism 543 revolves and elevates and lowers the arm 541. The nozzle 531 is attached to the moving body 542. The nozzle moving mechanism 54 can move the nozzle 531 between the upper part of the center of the substrate W2 held on the substrate holding part 52, and the upper part of the periphery of the substrate W2. Furthermore, the nozzle moving mechanism 54 can move the nozzle 531 to a standby position on the outer side of a cup 55 described below in a plan view.

With the substrate W2 held on the substrate holding part 52 and rotated at a predetermined rate, the nozzle 531 of the removal solution supply part 53 is placed above the substrate W2, and the removal solution L is supplied to the substrate W2 from the nozzle 531. At this time, the control part 3 controls the supply timing, supply time, supply rate and the like of the removal solution L by controlling the operation of the removal solution supply part 53. The removal solution L supplied to the substrate W2 spreads on the surface of the substrate W2 by a centrifugal force associated with the rotation of the substrate W2. Because of this, a reactant or denatured product of the layer to be processed is removed from the surface of the substrate W2.

The second processing part 5 includes a cup 55 having an outlet 551. The cup 55 is provided around the substrate holding part 52, and receives e.g. the removal solution scattered from the substrate W2. In the cup 55, the lifting mechanism 56 and a liquid release mechanism 57 are provided. The lifting mechanism 56 drives the cup 55 vertically. The liquid release mechanism 57 collects e.g. the removal solution scattered from the substrate W2 into the outlet 551, and releases it.

As described above, the layer to be processed is removed by the second processing part 5 to obtain a substrate W3. In the second processing part 5, "dry substrate" (S109) is performed to the obtained substrate W3. Examples of methods for drying the substrate in the second processing part 5 include a method in which a removal solution attached to the substrate W3 is released by continuously rotating the substrate W3 held on the substrate holding part 52. In addition, the substrate W3 may be dried by e.g. spraying a drying gas such as nitrogen gas or dry air. It should be noted that the substrate W3 may be dried after W3 is carried out of the second processing part 5.

The substrate W3 thus obtained is taken out of the second processing part 5 by the carrier mechanism 222, and "carry substrate out of the second processing part 5" (S110) is performed.

It should be noted that the second processing part 5 may include a drying solvent supply part, having a nozzle to discharge a drying solvent such as isopropyl alcohol (IPA) onto the substrate W2 held on the substrate holding part 52, and a drying solvent supply source to supply the drying solvent to the nozzle. In addition, the second processing part 5 may include a drying gas supply part, having a nozzle to discharge a drying gas such as nitrogen gas or dry air onto the substrate W2 held on the substrate holding part 52, and a drying gas supply source to supply the drying gas to the nozzle.

The present invention will now be described in more detail by way of Examples. It should be noted, however, that the present invention is not limited to these Examples.

EXAMPLE 1

A silicon substrate having a carbon hardmask film (film thickness 80 nm) including a polymer including ester bonds, ether bonds and elemental fluorine formed thereon was heated to 180° C. After heating the silicon substrate, a vapor generated by heating an aqueous solution including 50 mass % of nitric acid was supplied to the silicon substrate under atmospheric pressure at 180° C. for 3 minutes. It should be noted that the boiling point of nitric acid under atmospheric pressure is 82.6° C. After supplying the vapor, the carbon hardmask film was removed using a weakly basic water-water soluble ether mixed solution as a removal solution, followed by further performing water rinsing. The surface of the substrate after water rinsing was observed with a microscope, and the carbon hardmask film was removed well and the film thickness of the substrate was hardly reduced.

EXAMPLE 2

A silicon substrate having a carbon hardmask film (film thickness 80 nm) including a polymer including ester bonds, ether bonds and elemental fluorine formed thereon was heated at 300° C. for 150 seconds. After heating the silicon substrate, a vapor generated by heating a washing composition having 17.5 mass % of nitric acid, 12.5 mass % of polyacrylic acid, and 70 mass % of water to 300° C. was supplied to the silicon substrate at 300° C. for 2 minutes. After supplying the vapor, the carbon hardmask film was removed using a basic removal solution including dimethylsulfoxide and N-methyl-2-pyrrolidone, followed by further performing water rinsing. The surface of the substrate after water rinsing was observed with a microscope, and the carbon hardmask film was removed well and the film thickness of the substrate was hardly reduced.

EXAMPLE 3

The carbon hardmask film was removed in the same manner as in Example 2 except that the temperature when heating the silicon substrate was changed to 450° C. and the temperature when supplying the vapor was changed to 450° C. The surface of the substrate after water rinsing was observed with a microscope, and the carbon hardmask film was removed well and the film thickness of the substrate was hardly reduced.

EXAMPLE 4

A silicon substrate having a carbon hardmask film (film thickness 80 nm) including a polymer including ester bonds, ether bonds and elemental fluorine formed thereon was heated to 180° C. After heating the silicon substrate, a vapor generated by heating an aqueous solution including 50 mass % of trifluoromethanesulfonic acid was supplied to the silicon substrate under atmospheric pressure at 180° C. for a minute, 3 minutes or 5 minutes. It should be noted that the boiling point of trifluoromethanesulfonic acid under atmospheric pressure is 162° C. After supplying the vapor, the carbon hardmask film was removed using a weakly basic water-water soluble ether mixed solution as a removal solution, followed by further performing water rinsing. The surface of the substrate after water rinsing was observed with a microscope, and the carbon hardmask film was removed well and the film thickness of the substrate was hardly reduced in each case where the vapor supply time is a minute, 3 minutes or 5 minutes.

EXPLANATION OF REFERENCE NUMERALS

1 Substrate processing device
2 Substrate processing unit
3 Control unit
4 First processing part
41 Heating part
42 Vapor supply part
5 Second processing part
51 Chamber
52 Substrate holding part
53 Removal solution supply part

The invention claimed is:

1. A washing method, comprising:
heating a substrate with a layer to be reacted with a component (A) capable of decomposing the layer, wherein the heating is to a minimum temperature of 10° C. below the boiling point of the component (A) under atmospheric pressure;
reacting the layer to be processed and the component (A) by supplying a vapor of the component (A) to the heated substrate; and
removing the layer to be processed which has reacted with the component (A) from the substrate,
wherein the removing is performed using at least one removal solution selected from the group consisting of a basic mixed solution comprising water and a water-soluble ether and a basic mixed solution comprising dimethylsulfoxide and N-methyl-2-pyrrolidone.

2. The washing method according to claim 1, wherein the substrate is heated to a temperature higher than a boiling point of the component (A)—10° C.

3. The washing method according to claim 1, wherein the component (A) is nitric acid.

4. The washing method according to claim 1, wherein the component (A) is sulfonic acid.

5. The washing method according to claim 4, wherein the sulfonic acid is a fluorinated alkyl sulfonic acid.

6. The washing method according to claim 5, wherein the fluorinated alkyl sulfonic acid is one or more selected from the group consisting of trifluoromethanesulfonic acid, pentafluoroethanesulfonic acid, heptafluoropropanesulfonic acid, and nonafluorobutanesulfonic acid.

7. The washing method according to claim 1, wherein the substrate is heated to a high temperature which is a boiling point under atmospheric pressure of the component (A)—10° C. or higher and lower than the boiling point in the heating, and a temperature of the vapor is the boiling point under atmospheric pressure of the component (A) or higher and 500° C. or lower.

8. The washing method according to claim 1, wherein the heating is performed under atmospheric pressure, and the supplying in the reacting is performed under atmospheric pressure.

9. A washing method, comprising:
heating a substrate with a layer to be processed to a temperature higher than a boiling point under atmospheric pressure of a component (A) capable of decomposing the layer to be processed,
reacting the layer to be processed and the component (A) by supplying a vapor of the component (A) to the heated substrate, wherein a temperature of the vapor is the boiling point under atmospheric pressure of the component (A) or higher and 500° C. or lower, and
removing the layer to be processed which has reacted with the component (A) from the substrate,
wherein the removing is performed using at least one removal solution selected from the group consisting of a basic mixed solution comprising water and a water-soluble ether and a basic mixed solution comprising dimethylsulfoxide and N-methyl-2-pyrrolidone.

10. A washing method, comprising: according to claim 9,
heating a substrate with a layer to be processed to a temperature higher than a boiling point under atmospheric pressure of a component (A) capable of decomposing the layer to be processed,
reacting the layer to be processed and the component (A) by supplying a vapor of the component (A) to the heated substrate, wherein the component (A) is trifluoromethanesulfonic acid, and a temperature of the vapor is a boiling point under atmospheric pressure of the component (A) or higher and 200° C. or lower, and
removing the layer to be processed which has reacted with the component (A) from the substrate,
wherein the removing is performed using at least one removal solution selected from the group consisting of a basic mixed solution comprising water and a water-soluble ether and a basic mixed solution comprising dimethylsulfoxide and N-methyl-2-pyrrolidone.

11. The washing method according to claim 10, wherein the heating is performed under atmospheric pressure, and the supplying in the reacting is performed under atmospheric pressure.

12. The washing method according to claim 9, wherein the component (A) is one or more selected from the group consisting of trifluoromethanesulfonic acid, pentafluoroethanesulfonic acid, heptafluoropropanesulfonic acid, and nonafluorobutanesulfonic acid.

13. The washing method according to claim 9, wherein the heating is performed under atmospheric pressure, and the supplying in the reacting is performed under atmospheric pressure.

* * * * *